(12) United States Patent (10) Patent No.: US 7,425,083 B2
Kim et al. (45) Date of Patent: Sep. 16, 2008

(54) LIGHT EMITTING DEVICE PACKAGE

(75) Inventors: Hyung-kun Kim, Suwon-si (KR); Yu-sik Kim, Suwon-si (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 187 days.

(21) Appl. No.: 11/347,257

(22) Filed: Feb. 6, 2006

(65) Prior Publication Data

US 2006/0245195 A1 Nov. 2, 2006

(30) Foreign Application Priority Data

May 2, 2005 (KR) ............ 10-2005-0036688
Sep. 23, 2005 (KR) ............ 10-2005-0088715

(51) Int. Cl.
*F21V 29/00* (2006.01)

(52) U.S. Cl. ............ 362/294; 362/373; 257/E33.058; 257/E33.056; 257/E33.075; 257/98

(58) Field of Classification Search ............ 362/257, 362/800, 294, 373; 200/98, 99, 100; 257/98, 257/99, 100, E33.058, E33.056, E33.075
See application file for complete search history.

(56) References Cited

U.S. PATENT DOCUMENTS 7,301,175 B2 * 11/2007 Izuno et al. ............ 257/98
2003/0218180 A1 * 11/2003 Fujiwara ............ 257/100

* cited by examiner

*Primary Examiner*—Thomas M Sember
(74) *Attorney, Agent, or Firm*—Buchanan Ingersoll & Rooney PC

(57) ABSTRACT

A light emitting device package is provided. The light emitting device package includes a light emitting device; a package body on which the light emitting device is loaded and which dissipates heat generated from the light emitting device to the outside; a first electrode formed in the package body in a single body; and a second electrode inserted into the package body.

24 Claims, 5 Drawing Sheets

LIGHT EMITTING DEVICE PACKAGE

CROSS-REFERENCE TO RELATED PATENT APPLICATION

This application claims the benefit of Korean Patent Application Nos. 10-2005-0036688, filed on May 2, 2005, and 10-2005-0088715, filed on Sep. 23, 2005 in the Korean Intellectual Property Office, the disclosures of which are incorporated herein in their entirety by reference.

BACKGROUND OF THE DISCLOSURE

1. Field of the Disclosure

The present disclosure relates to a light emitting device package, and more particularly, to a light emitting device package which can be manufactured in a simplified process with reduced costs, and which possesses improved reliability and luminous efficiency.

2. Description of the Related Art

FIG. 1 is a partial cross-sectional view of a conventional light emitting device package. Referring to FIG. 1, a light emitting device 12 is attached to a heat sink 14 which is placed under the light emitting device 12 to dissipate heat generated from the light emitting device 12 to the outside. The light emitting device 12 may be a light emitting diode or a laser diode. The heat sink 14 may be formed of a material possessing good thermal conductivity such as a metal. Outside of the heat sink 14, a package housing 10 formed of plastic or polymer is placed to surround the heat sink 14. The upper surface of the light emitting device 12 is connected to an electrode 16 by a bonding wire 18 made of gold (Au).

However, as the heat sink 14 and the package housing 10 are made of different materials and then are bonded, the package manufacturing process is complex and the manufacturing time and cost are increased. Moreover, since the heat sink 14 and the package housing 10 are made of different materials having different thermal expansion coefficients, a bonding characteristics may decrease at an interface between the heat sink 14 and the package housing 10, thereby reducing the reliability of the light emitting device package.

SUMMARY OF THE DISCLOSURE

The present invention may provide a light emitting device package which can be manufactured in a simplified process with reduced costs and which possesses improved reliability and luminous efficiency.

According to an aspect of the present invention, there may be provided a light emitting device package comprising: a light emitting device; a package body on which the light emitting device is loaded and which dissipates heat generated from the light emitting device to the outside; a first electrode formed in the package body in a single body; and a second electrode inserted into the package body.

The light emitting device package may be formed of copper (Cu), copper (Cu) alloy, aluminum (Al) or aluminum (Al) alloy. The light emitting device package may be formed of oxygen free high conductivity (OFHC) Cu or copper-tungsten (Cu—W) alloy.

Also, the second electrode may be formed of OFHC Cu, Cu alloy, Al, Al alloy or KOVAR alloy.

A cavity may be formed in the upper portion of the package body, and the light emitting device may be loaded on the bottom surface of the cavity. The lateral portion of the cavity may have a concave rounded shape. A first groove may be formed in a predetermined shape corresponding to the loaded light emitting device in the bottom surface of the cavity. A second groove may be formed in a predetermined shape in the upper surface of the cavity body outside the cavity.

The second electrode may pass through the package body and an end portion thereof may be exposed from the bottom surface or the lateral portion of the cavity. An insulating material such as a ceramic or glass may be interposed between the second electrode and the package body.

A reflection coating layer may be formed on the entire surface of the package body. The reflection coating layer may be formed only on the lateral portion and the bottom surface of the cavity. The reflection coating layer may be formed of silver (Ag) or aluminum (Al).

According to another aspect of the present invention, there may be provided a light emitting device comprising: a light emitting device; a package body in which a cavity is formed in its upper portion, and the light emitting device is loaded on the bottom surface of the cavity, and the lateral portion of the cavity has a concave rounded shape; a first electrode formed in a single body of the package body; and a second electrode is inserted in the package body.

BRIEF DESCRIPTION OF THE DRAWINGS

The above and other features and advantages of the present invention will be described in detailed exemplary embodiments thereof with reference to the attached drawings in which.

DETAILED DESCRIPTION OF THE EXEMPLARY EMBODIMENTS

Figure 1:
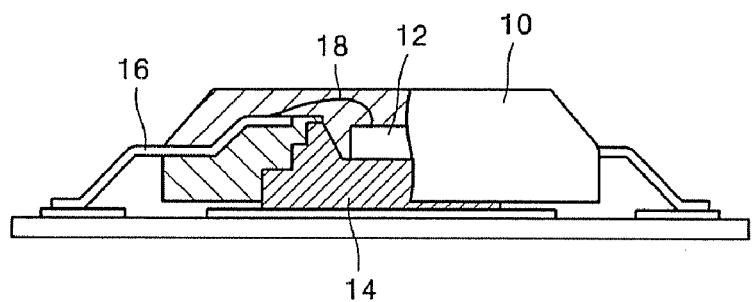
FIG. 1 illustrates a conventional light emitting device package.

The present invention will now be described more fully with reference to the accompanying drawings, in which exemplary embodiments of the invention are shown. Like reference numerals in the drawings denote like elements.

Figure 2:
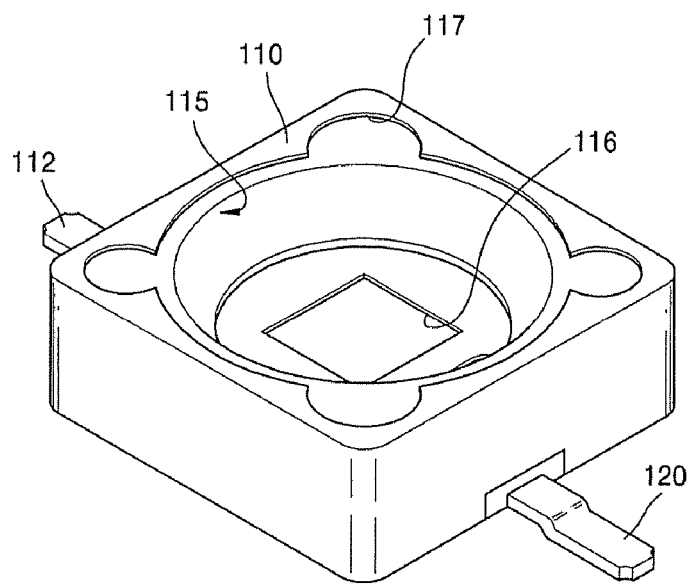
FIG. 2 is a perspective view of a package body of a light emitting device package according to an embodiment of the present invention.
Figure 3:
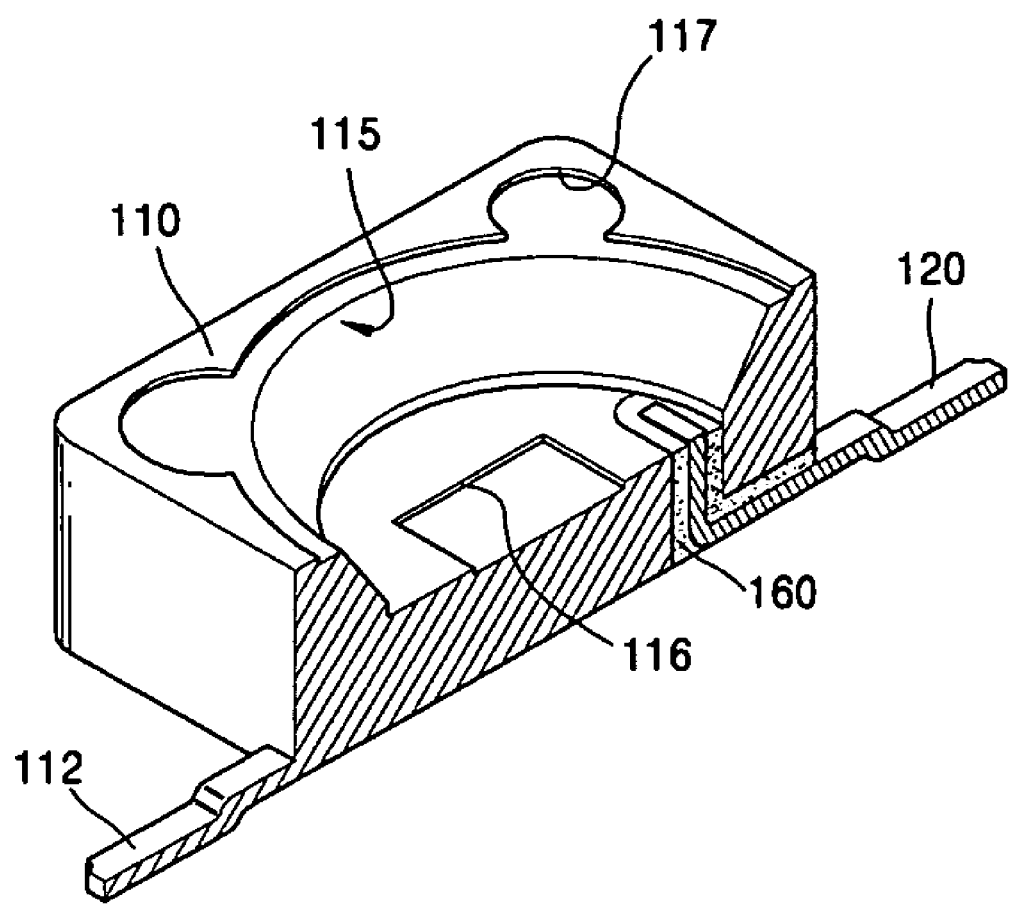
FIG. 3 is a partial perspective cut-away view of the package body of FIG. 2, according to an embodiment of the present invention.

FIG. 2 is a perspective view of a package body 110 of a light emitting device package according to an embodiment of the present invention; FIG. 3 is a partial perspective cut-away view of the package body of FIG. 2; and FIG. 4 is a cross-sectional view of the light emitting device package according to an embodiment of the present invention.

Figure 4:
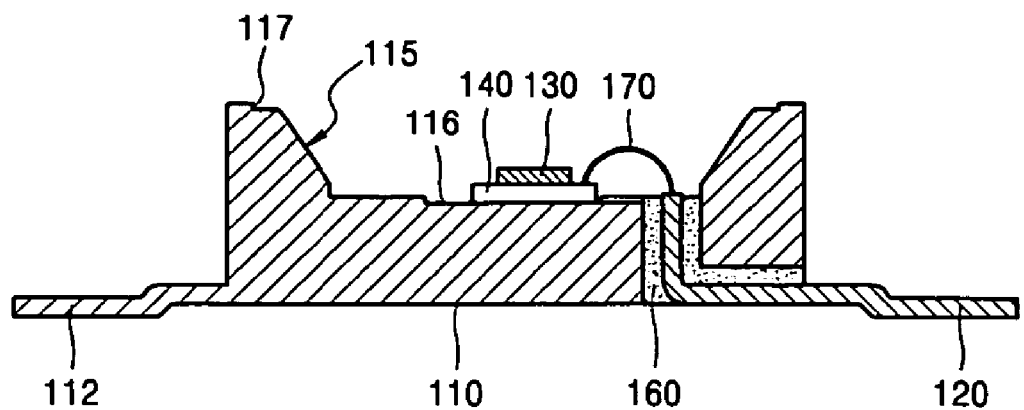
FIG. 4 is a cross-sectional view of the light emitting device package according to an embodiment of the present invention.

Referring to FIGS. 2 through 4, the light emitting device package includes a light emitting device 130, the package body 110 on which the light emitting device 130 is loaded, a first electrode 112 formed in a single body in the package body 110, and a second electrode 120 inserted into the package body 110.

In the present embodiment, a flip chip bonding process is used to bond the light emitting device 130 loaded on the package body 100. A pair of first and second electrode layers (not shown), for example, p- and n-type electrode layers, are formed in a bonding surface of the light emitting device 130. The light emitting device 130 may be a light emitting diode (LED) or a laser diode (LD).

The package body 110 on which the light emitting device 130 is loaded is formed in a single body. The package body 110 functions as a heat sink to dissipate heat generated from the light emitting device 130 and as a package housing to surround the heat sink at the same time. Accordingly, heat generated from the light emitting device 130 is dissipated to the outside through the entire package body 110. The package body 110 may be formed of a good thermal conductivity metal such as copper (Cu), copper (Cu) alloy, aluminum (Al) or aluminum (Al) alloy. Specifically, the package body 110 may be formed of oxygen free high conductivity (OFHC) Cu or copper tungsten (Cu—W) alloy.

A cavity 115 in a predetermined form is formed in the upper portion of the package body 110, and the light emitting device is loaded on the bottom surface of the cavity 115. A first groove 116 may be formed in the bottom surface of the cavity 115 according to the shape of the loaded light emitting device 130. A second groove 117 may be formed in the upper surface of the package body 110 outside of the cavity 115 for easy loading of a lens.

A reflection coating layer (not shown) may be formed on the entire surface of the package body 110 to reflect light emitted from the light emitting device 130. The reflection coating layer may also be formed on the lateral portion and on the bottom surface of the cavity 115, which form the inner surface of the cavity 115. The surface of the package body 110, on which the reflection coating layer is formed, may be processed to be smooth as a mirror or to have a predetermined roughness. The reflection coating layer may be formed of silver (Ag) or aluminum (Al).

A submount 140 is interposed between the light emitting device 130 and the bottom surface of the cavity 115 to transfer heat generated from the light emitting device 130 to the package body 110 and connect the first and second electrodes 112 and 120 with the light emitting device 130 electrically. The submount 140 may be formed of a ceramic or silicon (Si).

The first electrode 112 from among the pair of electrodes for applying a current to the light emitting device 130 is formed in the package body 110 in a single body. Accordingly, the first electrode 112 is formed from a metal possessing good heat conductivity such as Cu or Cu alloy. The first electrode 112 applies the current to the first electrode layer (not shown) of the light emitting device 130 through the submount 140.

A second electrode 120 of the pair of electrodes for applying a current to the light emitting device 130 is inserted into the package body 110. An end portion of the second electrode 120 is exposed from the bottom surface of the cavity 115 of the package body 110. The end portion of the second electrode 120 protrudes from the bottom surface of the cavity 110 or is formed to the same height as the bottom surface of the cavity 15. The second electrode 120 may also be exposed from the lateral portion of the cavity 115. The second electrode 120 is electrically connected with the submount 140 by a bonding wire 170 to apply a current to the second electrode layer (not shown) of the light emitting device 130. Though not shown in the drawing, a pad to which a bonding wire 170 is attached and a wire for connecting the second electrode layer of the light emitting device 130 electrically are formed on the submount 140. The second electrode 120 may be formed of one of OFHC Cu, Cu alloy, Al, Al alloy and KOVAR alloy with good electric conductivity. An insulating material 160 is interposed between the second electrode 120 and the package body 110 to insulate the second electrode 120 from the package body 110.

Figure 5:
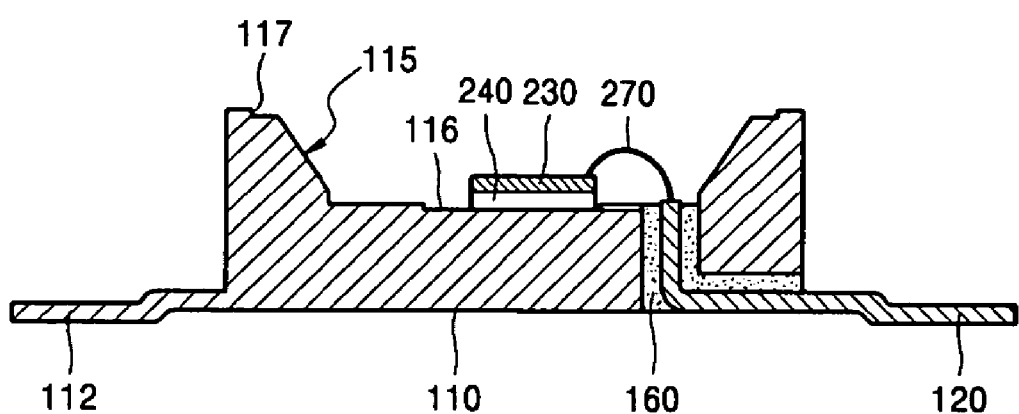
FIG. 5 is a cross-sectional view of a another example of the light emitting device package according to an embodiment of the present invention.

FIG. 5 is a cross-sectional view of a modified example of the light emitting device package according to an embodiment of the present invention. Referring to FIG. 5, a cavity 115 is formed in the upper portion of a package body 110 which is formed in a single body, and a light emitting device 230 is loaded on the bottom surface of the cavity 115. Further, a pair of first and second electrode layers (not shown) are formed on the bottom and top surfaces of the light emitting device 230. A first groove 116 may be formed in the bottom surface of the cavity 115 according to the shape of the light emitting device 230, and a second groove 117 may be formed in the upper surface of the package body 110 outside of the cavity 115 for easy loading of a lens. In addition, a conductive substrate 240 formed of silicon (Si) or a copper plate is interposed between the bottom surface of the light emitting device 230 and the bottom surface of the cavity 115.

A first electrode 112 is formed in a single body in the package body 110, and a second electrode 120 is inserted into the package body 110. Further, an insulating material is interposed between the second electrode 120 and the package body 110. The second electrode 120 is electrically connected by a bonding wire 270 to the upper surface of the light emitting device 230.

In such a configuration, the first electrode 112 applies a current to the first electrode layer formed on the bottom surface of the light emitting device 230 through the conductive substrate 240, and the second electrode 120 applies a current to the second electrode layer formed on the upper surface of the light emitting device 230 through a bonding wire 270.

As described above, in the light emitting device package according to the present embodiment, the package body 110 functioning as a heat sink and a package housing is manufactured in a single body to simplify the manufacturing process and to reduce the manufacturing time and costs. Furthermore, problems that might occur at the interface between the conventional heat sink and the package housing are solved, thus enhancing product reliability. Also, since the entire package body 110 is formed of a good heat conducting metal, heat dissipation is also improved compared to the conventional light emitting device package.

Figure 6:
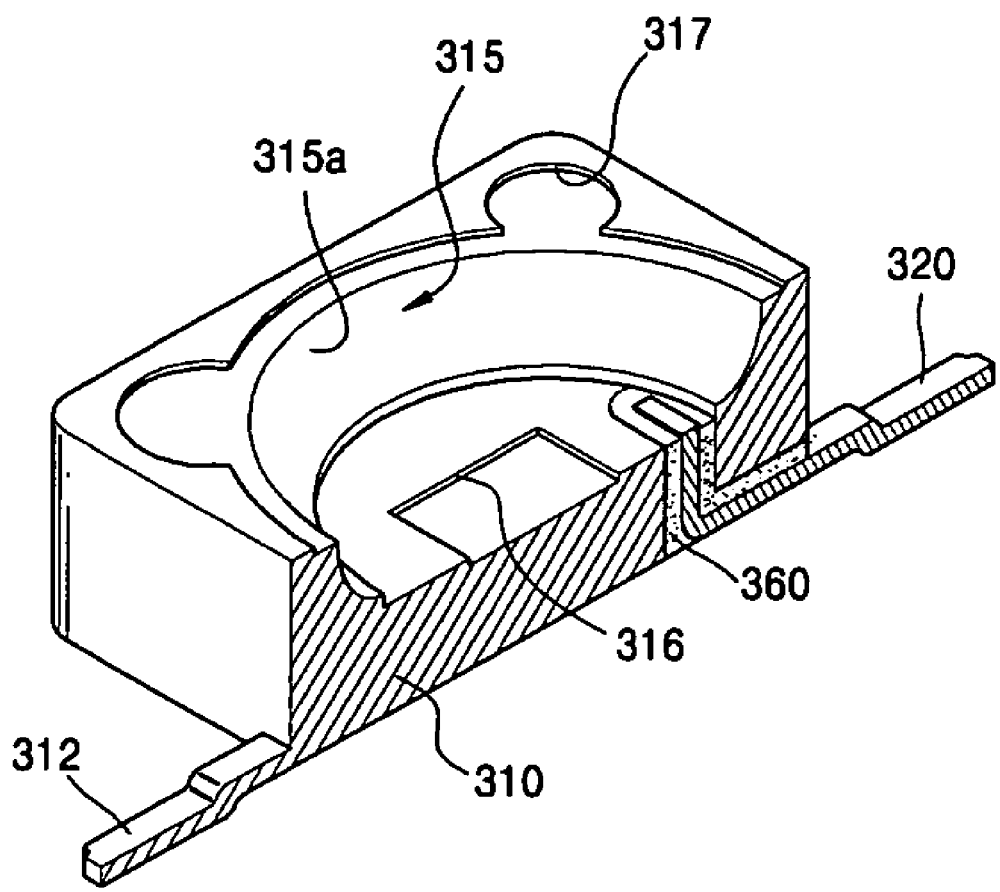
FIG. 6 is a partial perspective cut-away view of a package body of a light emitting device package according to another embodiment of the present invention.
Figure 7:
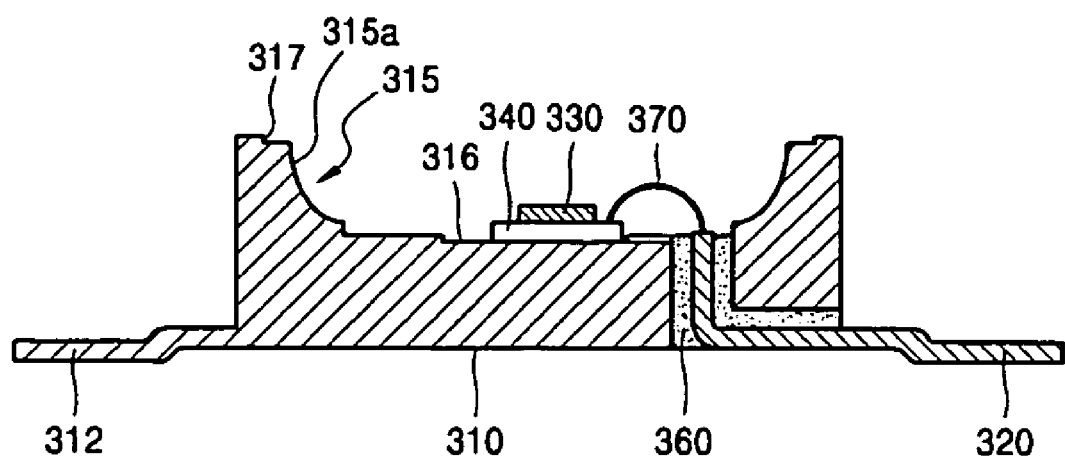
FIG. 7 a cross-sectional view of the light emitting device package according to another embodiment of the present invention.

FIG. 6 is a partial perspective cut-away view of a package body of a light emitting device package according to another embodiment of the present invention, and FIG. 7 a cross-sectional view of the light emitting device package according to another embodiment of the present invention.

Referring to FIGS. 6 and 7, a light emitting device package according to another embodiment of the present invention includes a light emitting device 330, a package body 310 on which the light emitting device 330 is loaded, a first electrode 312 formed in a single body in the package body 310, and a second electrode 320 inserted into the package body 310. In the present embodiment, a flip chip bonding process is applied to bond the light emitting device 330. A pair of first and second electrode layers (not shown), for example, p- and n-type electrode layers, are formed in a bonding surface of the light emitting device 330. The light emitting device 330 may be a light emitting diode (LED) or a laser diode (LD).

The package body 310 on which the light emitting device 330 is loaded, is formed in a single body. The package body 310 functions as a heat sink to dissipate heat from the light emitting device 330 and as a package housing to surround the heat sink at the same time. Accordingly, heat generated from the light emitting device 330 is dissipated to the outside through the entire package body 310. The package body 310 may be formed of a metal possessing good heat conductivity such as Cu, Cu alloy, Al, or Al alloy. Specifically, the package body 310 may be formed of oxygen free high conductivity (OFHC) Cu or Cu—W alloy.

In the upper portion of the package body 310, a cavity 315 in a predetermined form is formed, and the light emitting device is formed on the bottom surface of the cavity 315. A first groove 316 may be formed in the bottom surface of the cavity according to the shape and the size of the loaded light emitting device 330. A second groove 317 may be formed in the upper surface of the package body 310 outside of the cavity 315 for easy loading of a lens.

In the present embodiment, the cavity 315 has a lateral portion formed in a concave rounded shape. The cavity 315 having a lateral portion formed in a concave rounded shape reflects the light emitted from the light emitting device 330 to concentrate the light within a predetermined angle range. Accordingly, the light emitted from the light emitting device 330 and proceeding to the lateral portion 315a of the cavity is reflected at the lateral portion 315a of the cavity 315 and within a predetermined angle range to enhance the light extraction efficiency within a predetermined view angle. The enhancement of the light extraction efficiency can increase the luminous efficiency of the light emitting device. The curvature radius of the lateral portion 315a of the cavity 315 can vary according to a desired view angle.

A reflection coating layer (not shown) may be formed on a surface of the package body 310. Further, the reflection coating layer may be also formed on the lateral portion and the bottom surface of the cavity which form the inner surface of the cavity 315. The reflection coating layer may be formed of silver (Ag) or aluminum (Al). In addition, a submount 340 is provided to transfer heat generated from the light emitting device 130 to the package body 110 and electrically connect the first and second electrodes 312 and 320 with the light emitting device 330. The submount 340 may be formed of a ceramic or silicon (Si).

A first electrode 312 of the pair of the electrodes 312 and 320 to apply a current to the light emitting device 330 is formed in the package body 310 in a single body. Therefore, the first electrode 312 is formed of Cu, Cu alloy, Al or Al alloy as the package body 310 formed of a high thermal conductivity metal. The first electrode 312 applies the current to the first electrode layer (not shown) of the light emitting device 330 through the submount 340. A second electrode 320 of the pair of the electrodes 312 and 320 to apply a current to the light emitting device 330 is inserted in the package body 310. The end of the second electrode 320 is exposed from the bottom surface of the cavity 315. The end portion of the second electrode 320 is exposed to the bottom surface of the cavity 315 of the package body 310 or is formed to the same height with the bottom surface of the cavity 315. The end of the second electrode 320 may also be exposed from the lateral portion 315a of the cavity. The second electrode 320 is electrically connected to the submount 340 by the bonding wire 370 to apply current to the second electrode layer (not shown). Though not shown in the drawing, a pad to which a bonding wire 370 is attached and a wire for connecting the second electrode layer of the light emitting device 330 electrically are formed on the submount 340. The second electrode 320 may be formed of OFHC Cu, Cu alloy, Al, Al alloy or KOVAR alloy with good electric conductivity. Further, an insulating material 360 is interposed between the second electrode 320 and the package body 310 to insulate the second electrode 320 from the package body 310.

Figure 8:
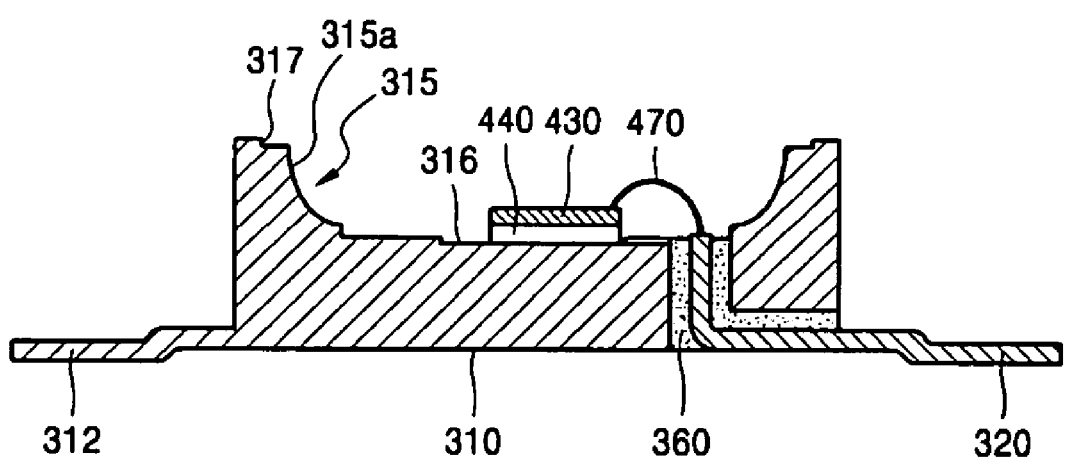
FIG. 8 is a cross-sectional view of a modified example of the light emitting device package according to another embodiment of the present invention.

FIG. 8 is a cross-sectional view of a modified example of the light emitting device package according to another embodiment of the present invention. Referring to FIG. 8, a cavity 315 of a predetermined configuration is formed in the upper portion of the package body 310 formed in a single body, and a light emitting device 430 is loaded on the bottom surface of the cavity 315. The cavity 315 is formed to have a lateral portion 315a in a concave rounded shape for enhancing the luminous efficiency.

A pair of first and second electrode layers (not shown) are formed respectively on the bottom surface and the upper surface of the light emitting device 430. A first groove 316 may be formed in the bottom surface of the cavity 315 in a predetermined configuration according to the shape or size of the light emitting device 430, and a second groove 317 may be formed in a predetermined shape for loading a lens on the upper surface of the package body 310 outside of the cavity 315. Further, a conductive substrate 440 made of silicon (Si) or a Cu plate is interposed between the light emitting device 430 and the bottom surface of the cavity 315. A first electrode 312 is formed in the package body in a single body, and a second electrode 320 is inserted into the package body 310. An insulating material 360 is interposed between the second electrode 320 and the package body 310. The second electrode 320 is electrically connected to the upper surface of the light emitting device 430 by the bonding wire 470.

In such a configuration, the first electrode 312 applies a current to the first electrode layer formed on the bottom surface of the light emitting device 430 through the conductive substrate 440. The second electrode 320 applies a current to the second electrode layer formed on the upper surface of the light emitting device 430 through the bonding wire 470.

In the present embodiments, two kinds of light emitting devices loaded in a package body formed in a single body have been described. However, several other kinds of light emitting devices may be used.

As described, the light emitting device package according to the present invention has following effects.

First, since the package body functioning as a heat sink and as a package housing is formed in a single body, the light emitting device package manufacturing process is simplified and the time and cost of the manufacturing process can be reduced.

Second, problems that may occur at the interface between the heat sink and the package housing in a conventional light emitting device package can be solved, thereby enhancing the reliability of the light emitting device package.

Third, the entire package body is formed of a good heat conductivity material and thus it has better heat dissipation capability compared to the conventional light emitting device package.

Fourth, since the lateral of the cavity formed in the upper portion of the package body has a concave rounded shape, the light extraction efficiency within a predetermined view angle can be enhanced and thus the luminous efficiency of the light emitting device package can be increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light emitting device package comprising:
a light emitting device;
a package body on which the light emitting device is loaded and which dissipates heat generated from the light emitting device to the outside;
a first electrode formed in the package body in a single body; and
a second electrode inserted into the package body,
wherein a cavity is formed in the upper portion of the package body, and the light emitting device is loaded on the bottom surface of the cavity,
wherein a first groove is formed in a predetermined shape corresponding to the loaded light emitting device in the bottom surface of the cavity, and
wherein a second groove is formed in a predetermined shape in the upper surface of the cavity body outside the cavity.

2. The light emitting device package of claim 1, wherein the package body is formed of a metal.

3. The light emitting device package of claim 2, wherein the package body is formed of copper (Cu), copper (Cu) alloy, aluminum (Al) or aluminum (Al) alloy.

4. The light emitting device package of claim 3, wherein the package body is formed of oxygen free high conductivity (OFHC) Cu or copper-tungsten (Cu—W) alloy.

5. The light emitting device package of claim 1, wherein the second electrode is formed of OFHC Cu, Cu alloy, Al, Al alloy or KOVAR alloy.

6. The light emitting device package of claim 1, wherein the second electrode passes through the package body and an end portion thereof is exposed from the bottom surface or the lateral of the cavity.

7. The light emitting device package of claim 6, wherein an insulating material is interposed between the second electrode and the package body.

8. The light emitting device package of claim 7, wherein the insulating material is a ceramic or glass.

9. The light emitting device package of claim 1, wherein a reflection coating layer is formed on the entire surface of the package body.

10. The light emitting device package of claim 9, wherein the reflection coating layer is formed of silver (Ag) or Al.

11. The light emitting device package of claim 1, wherein a reflection coating layer is formed on the lateral portion and the bottom surface of the cavity.

12. The light emitting device package of claim 11, wherein the reflection coating layer is formed of Ag or Al.

13. A light emitting device package comprising:
a light emitting device;
a package body in which a cavity is formed in its upper portion where the light emitting device is loaded on a bottom surface of the cavity and a lateral portion of the cavity has a concave rounded shape;
a first electrode formed in a single body of the package body; and
a second electrode inserted in the package body,
wherein a first groove corresponding to the shape of the loaded light emitting device is formed on the bottom surface of the cavity, and
wherein a second groove is formed in a predetermined shape in the upper surface of the cavity body outside the cavity.

14. The light emitting device of claim 13, wherein the package body is formed of metal.

15. The light emitting device of claim 14, wherein the package body is formed of Cu, Cu alloy, Al or Al alloy.

16. The light emitting device f claim 14, wherein the package body is formed of OFHC Cu or Cu—W alloy.

17. The light emitting device of claim 13, wherein the second electrode is formed of OFHC Cu, Cu alloy, Al, Al alloy or KOVAR alloy.

18. The light emitting device package of claim 13, wherein the second electrode passes through the package body and an end portion thereof is exposed from the bottom surface or the lateral portion of the cavity.

19. The light emitting device package of claim 18, wherein an insulating material is interposed between the second electrode and the package body.

20. The light emitting device package of claim 19, wherein the insulating material is a ceramic or glass.

21. The light emitting device package of claim 13, wherein a reflection coating layer is formed on the entire surface of the package body.

22. The light emitting device package of claim 21, wherein the reflection coating layer is formed of Ag or Al.

23. The light emitting device package of claim 13, wherein a reflection coating layer is formed on the lateral portion and the bottom surface of the cavity.

24. The light emitting device package of claim 23, wherein the reflection coating layer is formed of Ag or Al.

* * * * *